(12) United States Patent
Kim et al.

(10) Patent No.: US 10,499,507 B2
(45) Date of Patent: Dec. 3, 2019

(54) SOLID STATE DRIVE APPARATUS

(71) Applicant: Samsung Electronics Co., Ltd., Suwon-si, Gyeonggi-do (KR)

(72) Inventors: Ji-yong Kim, Suwon-si (KR); Su-in Kim, Seoul (KR); Myung-ryul Jang, Suwon-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 16/015,355

(22) Filed: Jun. 22, 2018

(65) Prior Publication Data

US 2019/0182956 A1    Jun. 13, 2019

(30) Foreign Application Priority Data

Dec. 8, 2017    (KR) .......................... 10-2017-0168483

(51) Int. Cl.
| H05K 5/00 | (2006.01) |
| H05K 1/14 | (2006.01) |
| H05K 1/18 | (2006.01) |

(52) U.S. Cl.
CPC ............ *H05K 1/145* (2013.01); *H05K 1/144* (2013.01); *H05K 1/181* (2013.01); *H05K 5/006* (2013.01); *H05K 5/0069* (2013.01); *H05K 2201/09163* (2013.01); *H05K 2201/10159* (2013.01); *H05K 2201/10356* (2013.01); *H05K 2201/10409* (2013.01); *H05K 2201/10522* (2013.01); *H05K 2201/10537* (2013.01); *H05K 2201/10545* (2013.01)

(58) Field of Classification Search
None
See application file for complete search history.

(56) References Cited

U.S. PATENT DOCUMENTS

| 5,768,110 A * | 6/1998 | Frommer | H05K 5/0269 174/365 |
| 7,008,240 B1 * | 3/2006 | Wang | H05K 5/0217 361/737 |
| 7,301,776 B1 * | 11/2007 | Wang | G06F 12/1416 360/137 |
| 7,450,398 B2 | 11/2008 | Oh et al. | |
| 7,517,231 B2 * | 4/2009 | Hiew | H05K 9/0067 439/76.1 |

(Continued)

FOREIGN PATENT DOCUMENTS

| KR | 10-2009-0010403 A | 1/2009 |
| KR | 10-2011-0041313 A | 4/2011 |

*Primary Examiner* — Courtney L Smith
*Assistant Examiner* — Rashen E Morrison
(74) *Attorney, Agent, or Firm* — Lee & Morse, P.C.

(57) ABSTRACT

A solid state drive (SSD) apparatus includes a body including a base plate and a sidewall extending along a periphery of the base plate, the sidewall including an upper sidewall protruding from an upper surface of the base plate and a lower sidewall protruding from a lower surface of the base plate, a first package substrate module housed in an area defined by the upper surface of the base plate and the upper sidewall, and a second package substrate module housed in an area defined by the lower surface of the base plate and the lower sidewall, wherein a height of the upper sidewall is greater than a height of the lower sidewall.

20 Claims, 20 Drawing Sheets

(56) References Cited

U.S. PATENT DOCUMENTS

| | | | | |
|---|---|---|---|---|
| 7,830,660 | B2 * | 11/2010 | Kang | G02F 1/133385 |
| | | | | 165/185 |
| 7,924,563 | B2 * | 4/2011 | Kobayashi | G06F 1/203 |
| | | | | 361/694 |
| 8,147,072 | B2 * | 4/2012 | Lin | G03B 21/16 |
| | | | | 353/52 |
| 8,305,770 | B2 * | 11/2012 | Gunderson | H05K 7/1418 |
| | | | | 361/679.01 |
| 8,363,417 | B2 * | 1/2013 | Gunderson | H05K 7/00 |
| | | | | 312/223.2 |
| 8,665,601 | B1 | 3/2014 | Mangay-Ayam, Jr. et al. | |
| 9,519,319 | B2 | 12/2016 | Dean et al. | |
| 9,933,822 | B2 * | 4/2018 | Tan | H05K 5/0008 |
| 2008/0266816 | A1 * | 10/2008 | Ni | H05K 5/0269 |
| | | | | 361/737 |
| 2010/0020515 | A1 | 1/2010 | Rubino et al. | |
| 2011/0089553 | A1 | 4/2011 | Kim et al. | |

* cited by examiner

US 10,499,507 B2

SOLID STATE DRIVE APPARATUS

CROSS-REFERENCE TO RELATED APPLICATION

Korean Patent Application No. 10-2017-0168483, filed on Dec. 8, 2017, in the Korean Intellectual Property Office, and entitled: "SOLID STATE DRIVE APPARATUS," is incorporated by reference herein in its entirety.

BACKGROUND

1. Field

Embodiments relate to a solid state drive (SSD) apparatus, and more particularly, to a SSD apparatus having a body accommodating package base substrates therein.

2. Description of the Related Art

As next-generation storage devices replacing existing hard disk drives, solid state drive (SSD) apparatuses have drawn attention. Such SSD apparatuses are based on non-volatile memory, consume a small amount of power, and have high storage densities. Also, when used as storage devices, the SSD apparatuses may quickly input and output a large amount of data. Since it has been required to improve the performance of a system including a SSD apparatus and decrease a size of the system, an increase in capacity of the SSD apparatus and reduction in a volume thereof are also required.

SUMMARY

According to an aspect of embodiments, there is provided a solid state drive apparatus including a body having a base plate and a sidewall with an upper sidewall protruding from an upper surface of the base plate and a lower sidewall protruding from lower surface of the base plate, the sidewall extending along a periphery of the base plate, a first package substrate module housed in an area defined by the upper surface of the base plate and the upper sidewall, and a second package substrate module housed in an area defined by the lower surface of the base plate and the lower sidewall, wherein a height of the upper sidewall is greater than a height of the lower sidewall.

According to another aspect of embodiments, there is provided a solid state drive apparatus including a body having a base plate with a penetration chip housing portion penetrating the base plate from an upper surface of the base plate to a lower surface of the base plate, and a sidewall with an upper sidewall protruding from the upper surface of the base plate and a lower sidewall protruding from the lower surface of the base plate, the sidewall extending along a periphery of the base plate, a first package substrate module housed in an area defined by the upper surface of the base plate and the upper sidewall and including a first package base substrate and a plurality of first semiconductor chips that include a plurality of first upper surface semiconductor chips mounted on an upper surface of the first package base substrate and a plurality of first lower surface semiconductor chips mounted on a lower surface of the first package base substrate, and a second package substrate module housed in an area defined by the lower surface of the base plate and the lower sidewall and including a second package base substrate and a plurality of second semiconductor chips mounted on an upper surface of the second package base substrate, wherein a portion of the plurality of first lower surface chips and a portion of the plurality of second semiconductor chips are housed in the penetration chip housing portion.

According to yet another aspect of embodiments, there is provided a solid state drive apparatus including a body having a base plate and a sidewall with an upper sidewall protruding from an upper surface of the base plate and a lower sidewall protruding from lower surface of the base plate, the sidewall extending along a periphery of the base plate, a first package substrate module housed in an area defined by the upper surface of the base plate and the upper sidewall and including a first package base substrate and a plurality of first semiconductor chips that include a plurality of first upper surface semiconductor chips mounted on an upper surface of the first package base substrate and a plurality of first lower surface semiconductor chips mounted on a lower surface of the first package base substrate, and a second package substrate module housed in an area defined by the lower surface of the base plate and the lower sidewall and including a second package base substrate and a plurality of second semiconductor chips mounted on an upper surface of the second package base substrate, wherein a lower surface of the second package base substrate and a lower portion of the lower sidewall are on a same plane.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1A:
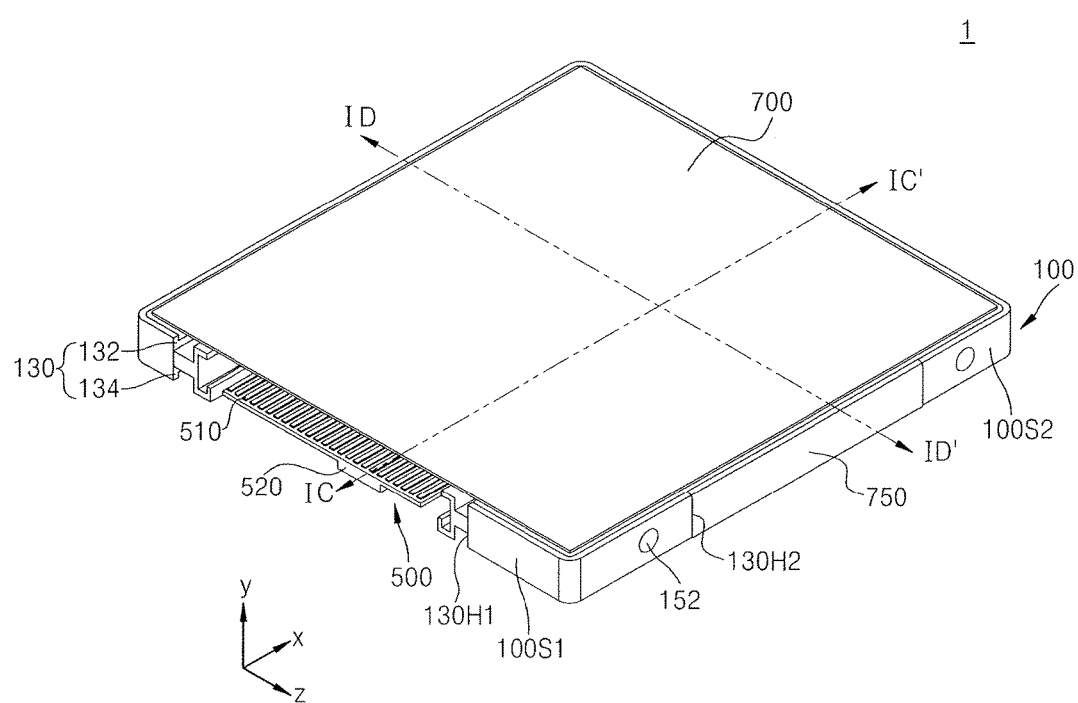
FIGS. 1A and 1B illustrate perspective views of a solid state drive (SSD) apparatus in different directions, according to an embodiment.
Figure 1B:
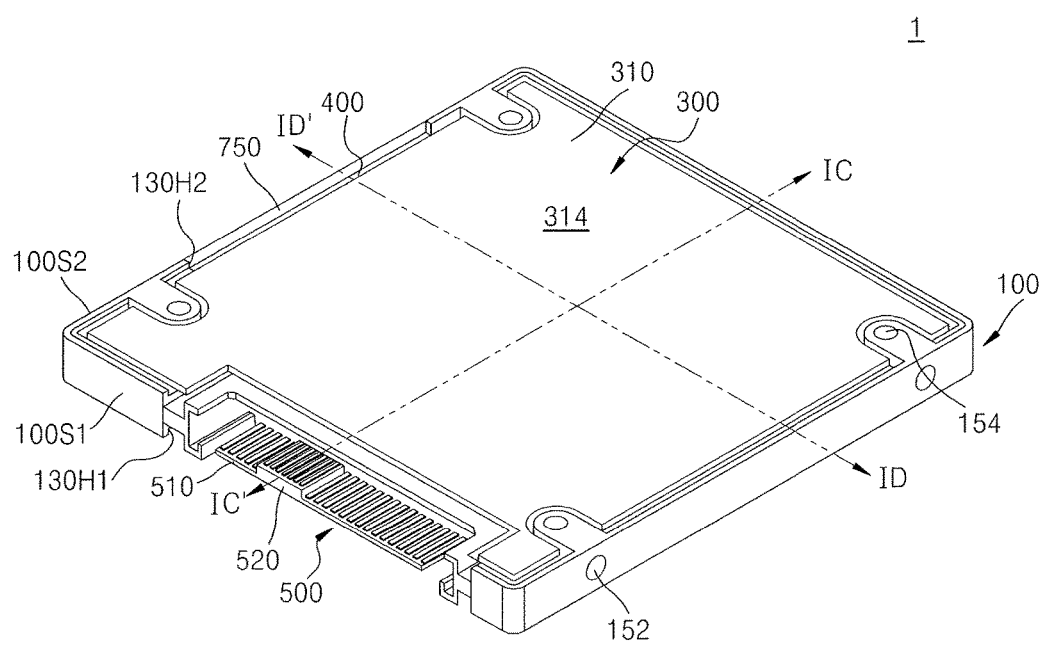
Figure 1C:
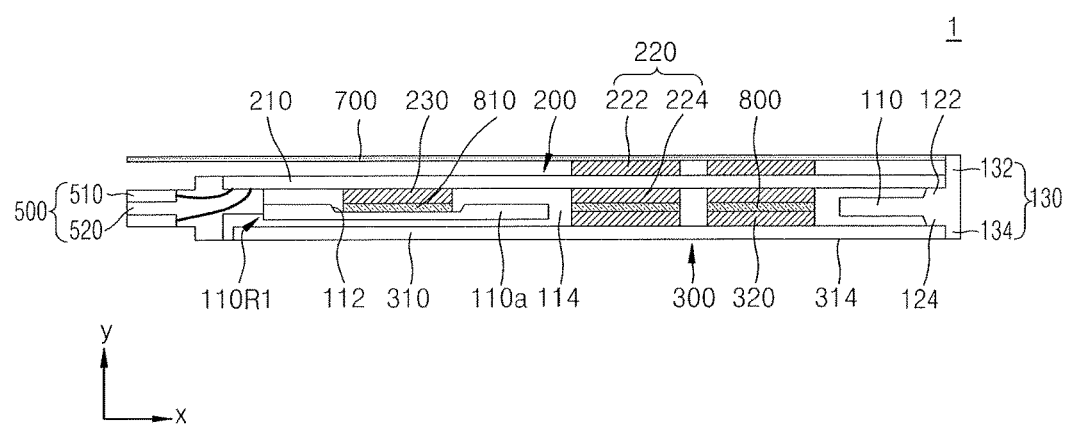
FIGS. 1C and 1D illustrate cross-sectional views of the SSD apparatus, taken along different directions, according to an embodiment.
Figure 1D:
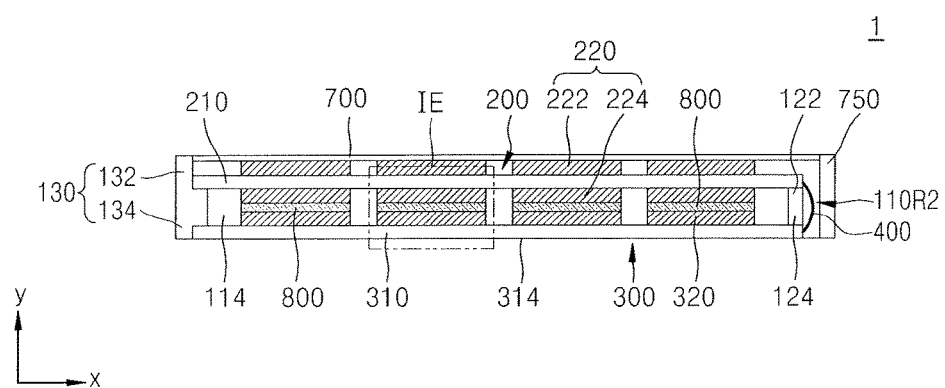
Figure 1E:
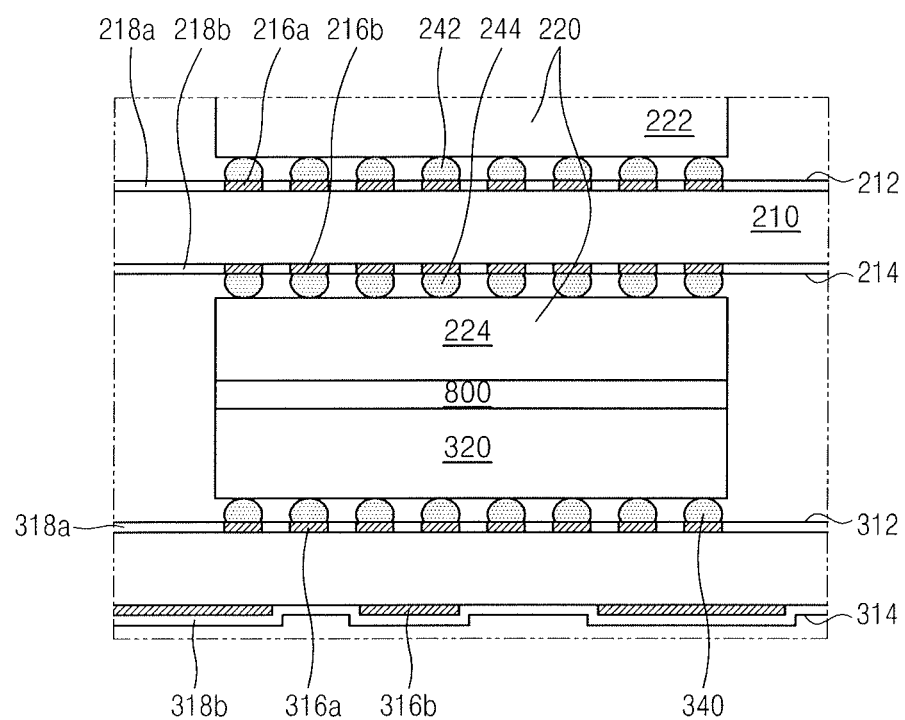
FIG. 1E illustrates an enlarged cross-sectional view of part of the SSD apparatus, according to an embodiment.

FIGS. 1A and 1B are perspective views of a solid state drive (SSD) apparatus 1 in different directions, according to an embodiment. FIGS. 1C and 1D are cross-sectional views of the SSD apparatus 1, taken along different directions, according to an embodiment. FIG. 1E is an enlarged cross-sectional view of part of the SSD apparatus 1, according to an embodiment. In particular, FIG. 1A is a perspective view of the SSD apparatus 1 from the top, and FIG. 1B is a perspective view of the SSD apparatus 1 from the bottom. Also, FIGS. 1C and 1D are cross-sectional views taken along lines IC-IC' and ID-ID' of FIGS. 1A and 1B, respectively, and FIG. 1E is an enlarged cross-sectional view of region IE of FIG. 1D.

Referring to FIGS. 1A to 1E, the SSD apparatus 1 may include a body 100, a first package substrate module 200, and a second package substrate module 300. Configurations of the body 100, the first package substrate module 200, and the second package substrate module 300 will be described in detail with reference to FIGS. 2A-4B.

Referring to FIGS. 1A and 1C, the body 100 may house therein the first package substrate module 200 and the second package substrate module 300. The body 100 may include a base plate 110 and a sidewall 130 extending along a periphery of the base plate 110, as illustrated in FIG. 1C. The sidewall 130 may include an upper sidewall 132 on an upper side of the base plate 110 and a lower sidewall 134 on a lower side of the base plate 110, e.g., the upper and lower sidewalls 132 and 134 may extend away from each other along the y-axis (FIG. 1C). An upper substrate support 122 and a lower substrate support 124 may protrude from an upper surface and a lower surface of the base plate 110, the upper substrate support 122 and the lower substrate support 124 being adjacent to the upper sidewall 132 and the lower sidewall 134, respectively.

For example, the base plate 110, the upper substrate support 122, the lower substrate support 124 and the sidewall 130 that form the body 100 may be integrally formed, e.g., as a single and seamless unit. In another example, some of the base plate 110, the upper substrate support 122, the lower substrate support 124, and the sidewall 130, which form the body 100, may be coupled to each other by press fitting or welding so that the base plate 110, the upper substrate support 122, the lower substrate support 124, and the sidewall 130 may be integrally formed.

A height of the upper sidewall 132, e.g., along the y-axis, may be greater than that of the lower sidewall 134, e.g., along the y-axis. In some embodiments, a total height of the sidewall 130 including the upper sidewall 132 and the lower sidewall 134 may be about 7 mm. The height of the sidewall 130 may be the same as a thickness of the SSD apparatus 1.

As illustrated in FIG. 1C, in an area defined by the upper surface of the base plate 110 and the upper sidewall 132, the first package substrate module 200 may be housed, and in an area defined by the lower sidewall 134 and the lower surface of the base plate 110, the second package substrate module 300 may be housed. The first package substrate module 200 and the second package substrate module 300 may respectively contact the upper substrate support 122 and the lower substrate support 124, and may be apart from the upper surface and the lower surface of the base plate 110 with gaps therebetween.

For example, as illustrated in FIG. 1C, the upper substrate support 122 may have a step structure extending from the base plate 110, so the first package substrate module 200 may be positioned on the upper substrate support 122, e.g., in direct contact with the upper substrate support 122 and the upper sidewall 132, at a predetermined distance above the base plate 110, e.g., a gap may be formed between the first package substrate module 200 and the base plate 110 due to the step structure of the upper substrate support 122. Similarly, as illustrated in FIG. 1C, the lower substrate support 124 may have a step structure extending from the base plate 110 in an opposite direction with respect to the upper substrate support 122, so the second package substrate module 300 may be positioned on the lower substrate support 124, e.g., in direct contact with the lower substrate support 124 and the lower sidewall 134, at a predetermined distance below the base plate 110, e.g., a gap may be formed between the second package substrate module 300 and the base plate 110 due to the step structure of the lower substrate support 124.

The first package substrate module 200 and the second package substrate module 300 may externally protrude less than an upper portion of the upper sidewall 132 and a lower portion of the lower sidewall 134.

As illustrated in FIGS. 1A and 1B, the sidewall 130 may include a first sidewall groove 130H1 in a first edge 100S1 of the body 100 and a second sidewall groove 130H2 in a second edge 100S2 of the body 100. That is, the first sidewall groove 130H1 and the second sidewall groove 130H2 may be portions where the sidewall 130 is not formed in the first edge 100S1 and the second edge 100S2 of the body 100, respectively. In some embodiments, the first edge 100S1 and the second edge 100S2 of the body 100 may be connected to each other.

As illustrated in FIGS. 1C and 1D, the base plate 110 may include a connector housing portion 110R1 and a signal transmission medium housing portion 110R2 which are recessed toward an inside of the body 100 from the first sidewall groove 130H1 and the second sidewall groove 130H2, respectively. Also, the base plate 110 may include a recess chip housing portion 112 extending inward from the upper surface of the base plate 110 and a penetration chip housing portion 114 penetrating the base plate 110 from the upper surface of the base plate 110 to the lower surface thereof, as will be explained in more detail below with reference to FIGS. 2A-2B.

An external connector 500 may be coupled to the connector housing portion 110R1. The signal transmission medium housing portion 110R2 may include a signal transmission medium 400 for electrically connecting the first package substrate module 200 and the second package substrate module 300 to each other (FIG. 1D). The signal transmission medium 400 may be, e.g., a film cable.

The external connector 500 may connect the SSD apparatus 1 to an external host via which signals and power are provided to the SSD apparatus 1. The external connector 500 may be a connector that is connected to an external device according to, e.g., parallel advanced technology attachment (PATA) standards, serial advanced technology attachment (SATA) standards, SCSI standards, or PCI Express (PCIe) standards. Here, the SATA standards include all SATA standards, e.g., SATA-1, SATA-2, SATA-3, and external SATA (e-SATA). The PCIe standards include all PCIe standards, e.g., PCIe 1.0, PCIe 2.0, PCIe 2.1, PCIe 3.0, and PCIe 4.0. The SCSI standards include all SCSI standards, e.g., parallel SCSI, serial attached SCSI (SAS), and iSCSI. In some embodiments, the external connector 500 may be a connector that supports an M2 interface, an mSATA interface, or a 2.5" interface.

For example, as illustrated in FIG. 1A, the external connector 500 may fill the first sidewall groove 130H1. The external connector 500 may include a terminal 510 electrically connected to the first package substrate module 200 (FIG. 1C) and a connector body 520 supporting the terminal 510, e.g., the connector body 520 may be positioned in the first sidewall groove 130H1 with a plurality of terminals 510 aligned on opposite surfaces of the connector body 520 (FIGS. 1A-1B). The terminal 510 may be electrically connected to the second package substrate module 300 through the first package substrate module 200. For example, the second package substrate module 300 may be electrically connected to the first package substrate module 200 through the signal transmission medium 400 and then to the terminal 510 through the first package substrate module 200.

As illustrated in FIGS. 1A and 1D, the second sidewall groove 130H2 may be coupled to a sidewall groove covering part 750. Outer surfaces of the sidewall 130 and the sidewall groove covering part 750 may be on the same plane at the second edge 100S2, e.g., outer surfaces of the sidewall 130 and the sidewall groove covering part 750 in the xy-plane may be level with each other (FIG. 1A). In some embodiments, the sidewall groove covering part 750 may not be formed.

In some embodiments, as illustrated in FIG. 1B, a first screw hole 152 and a second screw hole 154 for coupling the SSD apparatus 1 to the external device may be respectively formed in a side surface and the lower surface of the body 100.

As illustrated in FIGS. 1C and 1D, the first package substrate module 200 may include a first package base substrate 210, first semiconductor chips 220, and a controller chip 230. The first package substrate module 200 may be a dual in-lined memory module (DIMM) in which the first semiconductor chips 220 are respectively mounted on opposite surfaces, e.g., on an upper surface 212 and a lower surface 214 of the first package base substrate 210 (FIG. 1E).

As illustrated in FIG. 1E, the first semiconductor chips 220 may include first upper surface semiconductor chips 222 attached to the upper surface 212 of the first package base substrate 210 and first lower surface semiconductor chips 224 attached to the lower surface 214 of the first package base substrate 210. The controller chip 230 may be attached to the lower surface of the first package base substrate 210, e.g., to a surface of the first package base substrate 210 facing the second package substrate module 300.

A method of mounting the first semiconductor chips 220 and the controller chip 230 on the first package base substrate 210 may be, e.g., a ball grid array (BGA) method, a pin grid array (PGA) method, a tape carrier package (TCP) method, a chip-on-board (COB) method, a quad flat non-leaded (QFN) method, a quad flat package (QFP) method, or the like. However, the method is not limited thereto.

As further illustrated in FIG. 1E, a first upper surface solder resist layer 218a and a first lower surface solder resist layer 218b, which cover at least a portion of each of wire patterns arranged on the upper surface 212 and the lower surface 214 of the first package base substrate 210, may be formed on the upper surface 212 and the lower surface 214 of the first package base substrate 210, respectively. Portions of the wire patterns, which are arranged on the upper surface 212 and the lower surface 214 of the first package base substrate 210 and are not covered by the first upper surface solder resist layer 218a and the first lower surface solder resist layer 218b, may be a first upper surface pad 216a and a first lower surface pad 216b.

For example, the first upper surface semiconductor chips 222 may be electrically connected to the first upper surface pad 216a of the first package base substrate 210 through first upper surface chip connection terminals 242, and the first lower surface semiconductor chips 224 may be electrically connected to the first lower surface pad 216b of the first package base substrate 210 through first lower surface chip connection terminals 244. The first upper surface chip connection terminal 242 and the first lower surface chip connection terminal 244 may each be, e.g., a bump or a solder ball.

The second package substrate module 300 may include a second package base substrate 310 and second semiconductor chips 320. The second package substrate module 300 may be a single in-lined memory module (SIMM) in which the second semiconductor chips 320 are mounted only on one surface, e.g., on an upper surface 312 of the second package base substrate 310. The second semiconductor chips 320 may be attached to the upper surface 312 of the second package base substrate 310, e.g., to face the first package substrate module 200 (FIG. 1C). A method of mounting the second semiconductor chips 320 and the second package base substrate 310 may be, e.g., a BGA method, a PGA method, a TCP method, a COB method, a QFN method, a QFP method, or the like. However, the method is not limited thereto.

As further illustrated in FIG. 1E, a second upper surface solder resist layer 318a, which covers at least a portion of a wire pattern on the upper surface 312 of the second package base substrate 310, may be formed on the upper surface 312 of the second package base substrate 310. A second lower surface solder resist layer 318b, which completely covers a lower surface wire pattern 316b on the lower surface 314 of the second package base substrate 310, may be formed on the lower surface 314 of the second package base substrate 310. A portion of the wire pattern, which is on the upper surface 312 of the second package base substrate 310 and is not covered by the second upper surface solder resist layer 318a, may be a second upper surface pad 316a.

For example, the second semiconductor chips 320 may be electrically connected to the second package base substrate 310 through second chip connection terminals 340. The second chip connection terminal 340 may be, e.g., a bump or a solder ball.

In other words, some portions of the wire patterns on the upper surface 212 and the lower surface 214 of the first package base substrate 210, i.e., the first upper surface pad 216a and the first lower surface pad 216b, may not be covered by the first upper surface solder resist layer 218a and the first lower surface solder resist layer 218b, and may be exposed to the outside. In addition, a portion of the wire pattern on the upper surface 312 of the second package base substrate 310, i.e., the second upper surface pad 316a, may not be covered by the second upper surface solder resist layer 318a and may be exposed to the outside.

However, the wire pattern on the lower surface 314 of the second package base substrate 310, i.e., the lower surface wire pattern 316b, may be completely covered by the second lower surface solder resist layer 318b and thus may not be exposed to the outside. Thus, the second lower surface solder resist layer 318b may completely cover the lower surface 314 of the second package base substrate 310. In some embodiments, the lower surface 314 of the second package base substrate 310 may be completely covered by an insulating film, instead of the second lower surface solder resist layer 318b. In other embodiments, the insulating film may be additionally attached to the second lower surface solder resist layer 318b and may completely cover the lower surface 314 of the second package base substrate 310.

The lower surface 214 of the first package base substrate 210 may face the upper surface of the base plate 110, and the upper surface 312 of the second package base substrate 310 may face the lower surface of the base plate 110.

A portion of the controller chip 230 may be housed in the recess chip housing portion 112, as illustrated in FIG. 1C. In particular, the controller chip 230 may protrude downward more than the upper surface of the base plate 110, and thus, a portion of the controller chip 230 may be housed in the recess chip housing portion 112. In some embodiments, a first heat transfer member 800 may be disposed between a lower surface of the recess chip housing portion 112 and the controller chip 230.

A portion of each of the first lower surface semiconductor chip 224 and the second semiconductor chip 320 may be housed in the penetration chip housing portion 114. In particular, the first lower surface semiconductor chip 224 may protrude downwards more than the upper surface of the base plate 110, and the second semiconductor chip 320 may protrude upwards more than the lower surface of the base plate 110. Therefore, a portion of each of the first lower surface semiconductor chip 224 and the second semiconductor chip 320 may be housed in the penetration chip housing portion 114. In some embodiments, in the penetration chip housing portion 114, a second heat transfer member 810 may be disposed between the first lower surface semiconductor chip 224 and the second semiconductor chip 320.

The first heat transfer member 800 and the second heat transfer member 810 may each include an insulating material or a material including an insulating material and helping the first heat transfer member 800 and the second heat transfer member 810 maintain an electrical insulating property. The first heat transfer member 800 and the second heat transfer member 810 may each include, e.g., epoxy resin. The first heat transfer member 800 and the second heat transfer member 810 may each include, e.g., mineral oil, grease, gap filler putty, phase change gel, phase change material pads, or particle filled epoxy. Examples of grease that may be commonly used include ShinEtsu G750, ShinEtsu G751, ShinEtsu G765, and Berquist TIC-7500, and examples of a phase change material include Thermax HF60110-BT, Chromerics T725, Chromerics T443, Chromerics T454, Thermagon T-pcm 905c, Berquist 200U, Berquist HiFlow 225-U, and Berquist HiFlow 225-UT. Examples of a thermal conductive adhesive include Chromerics therm-A-form T642 and the like. However, materials of the first heat transfer member 800 and the second heat transfer member 810 are not limited thereto.

The SSD apparatus 1 may cover an upper side of the first package substrate module 200 and may further include the upper surface cover portion 700 connected to the upper portion of the upper sidewall 132. An upper surface of the upper surface cover portion 700 and the upper portion of the upper sidewall 132 may be on the same plane, e.g., level with each other. Side surfaces of the SSD apparatus 1 may be covered by the sidewall 130 and an upper surface of the SSD apparatus 1 may be covered by the upper surface cover portion 700. At the bottom of the SSD apparatus 1, a lower surface of the second package substrate module 300, i.e., the lower surface 314 of the second package base substrate 310, may be exposed. The lower surface 314 of the second package base substrate 310 and the lower portion of the lower sidewall 134 may be on the same plane, e.g., level with each other.

The upper surface cover portion 700 may include, e.g., metal, a carbon-based material, or a combination thereof. For example, the metal may be copper (Cu), aluminum (Al), zinc (Zn), tin (Sn), stainless steel, or the like, but is not limited thereto. The carbon-based material may be, e.g., graphite, graphene, carbon fibers, a carbon nanotube (CNT) composite, or the like, but is not limited thereto.

The SSD apparatus 1 according to an embodiment may have a relatively small thickness and may include two package substrate modules, i.e., the first package substrate module 200 and the second package substrate module 300. In particular, since the body 100 includes the base plate 110 with the recess chip housing portion 112 and the penetration chip housing portion 114 that accommodate semiconductor chips of the first and second package substrate modules 200 and 300, the overall thickness of the SSD apparatus 1 may be smaller, e.g., as compared to an SSD apparatus having semiconductor chips on a base plate without recesses and/or openings therethrough. Therefore, since thickness of portions of the base plate 110 that accommodate semiconductor chips of the first and second package substrate modules 200 and 300 is reduced, an overall thickness of the SSD apparatus 1 may be reduced, while increasing capacity, e.g., two package substrate modules as opposed to only one.

That is, since the body 100 includes the base plate 110 including the recess chip housing portion 112 and the penetration chip housing portion 114, the first package substrate module 200, which have the upper surface 212 and the lower surface 214 to which semiconductor chips are attached, and the second package substrate module 300. which has the upper surface 312 to which the semiconductor chips are attached, may be housed in the body 100, even though a thickness of the body 100 does not increase. In detail, portions of the first lower surface semiconductor chips 224, which are on the lower surface 214 of the first package substrate module 200, and the second semiconductor chips 320, which are on the upper surface 312 of the second package substrate module 300, may be housed in the penetration chip housing portion 114.

The SSD apparatus 1 according to an embodiment may have a relatively small thickness, may maintain the strength thereof due to the base plate 110 and the sidewall 130 of the body 100, and may include a relatively large amount of semiconductor chips. Therefore, the SSD apparatus 1 according to an embodiment may satisfy a capacity increase as well as a volume reduction.

Figure 2A:
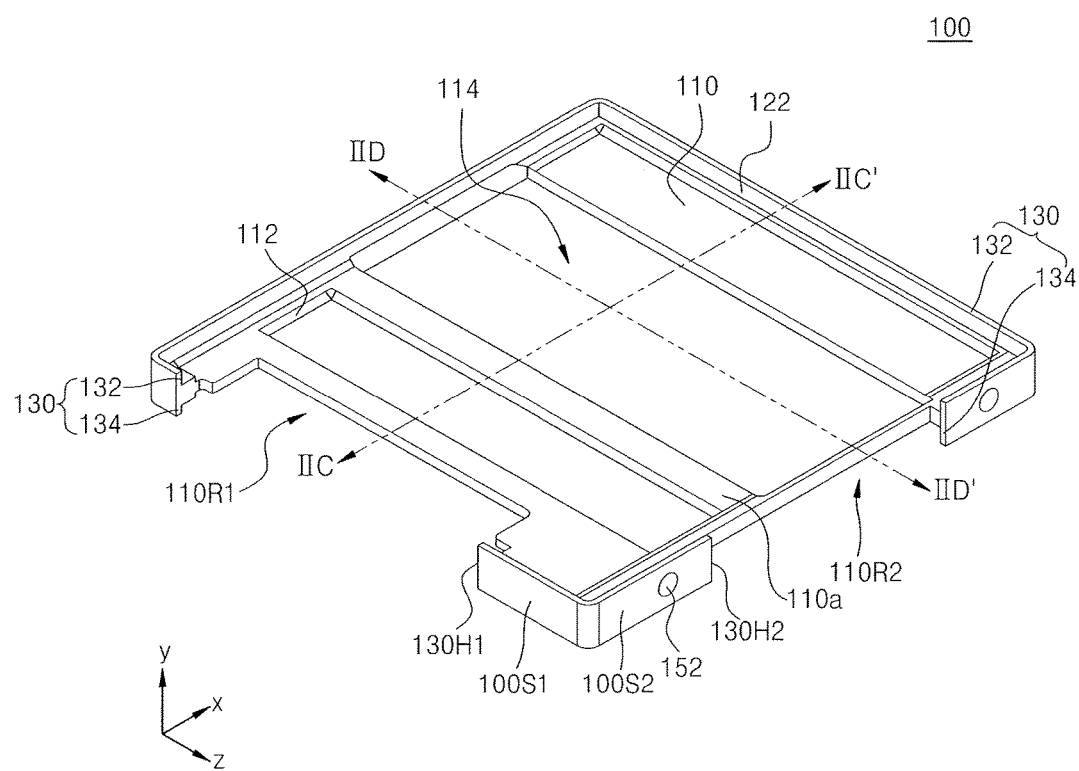
FIGS. 2A and 2B illustrate perspective views of a body of the SSD apparatus in different directions, according to an embodiment.
Figure 2B:
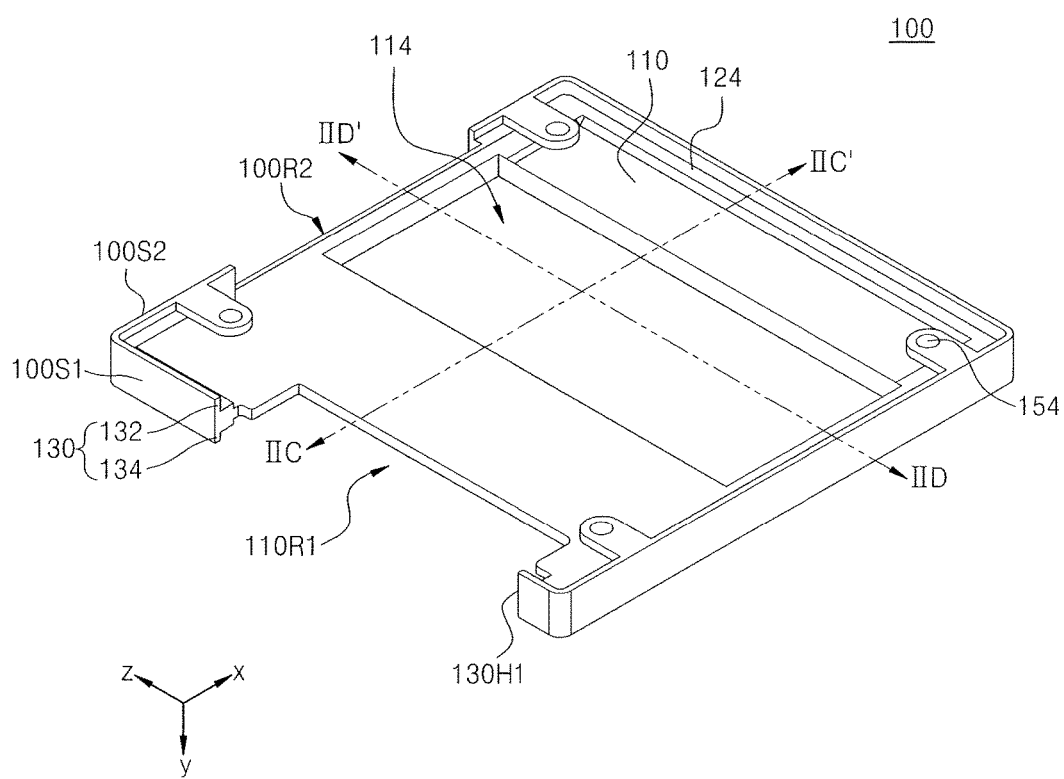
Figure 2C:
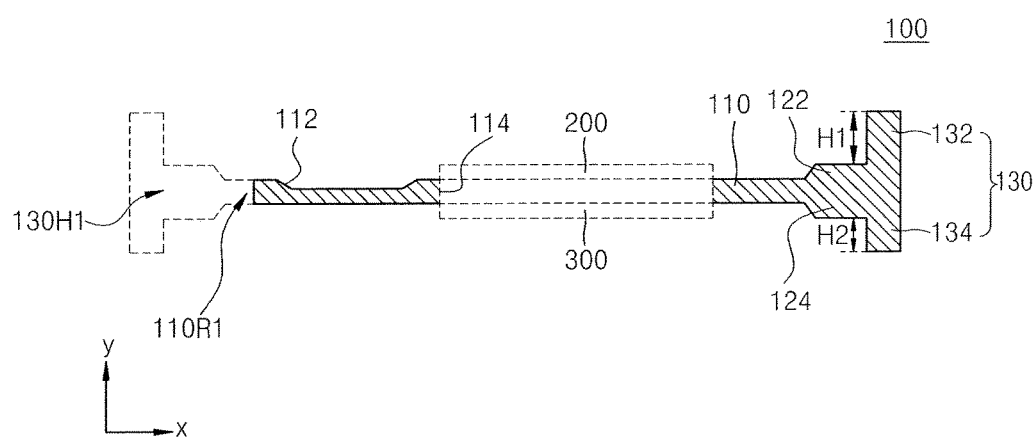
FIGS. 2C and 2D illustrate cross-sectional views the body of the SSD apparatus, taken along different directions, according to an embodiment.
Figure 2D:
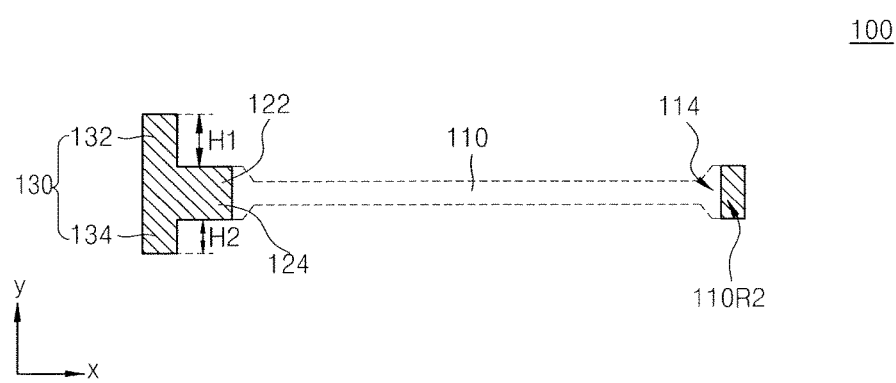

FIGS. 2A and 2B are perspective views of the body 100 of the SSD apparatus 1 in different directions, according to an embodiment. FIGS. 2C and 2D are cross-sectional views of the body 100 of the SSD apparatus 1, along different directions, according to an embodiment. In detail, FIG. 2A is a perspective view of the body 100 of the SSD apparatus 1 from the top, and FIG. 2B is a perspective view of the body 100 from the bottom. Also, FIGS. 2C and 2D are cross-sectional views respectively taken along lines IIC-IIC' and IID-IID' of FIGS. 2A and 2B. For convenience of explanation, in comparison to the cross-sectional views of FIGS. 1C and 1D, the cross-sectional views of FIGS. 2C and 2D have a different aspect ratio. Also, in FIGS. 2C and 2D, the cross-sectional views along lines IIC-IIC' and IID-IID' are indicated by the hatched portions, while the non-hatched portions (indicated by dashed lines lines) are separate from the cross-sections taken along the lines IIC-IIC' and IID-IID' and indicate openings (for clarity).

Referring to FIGS. 2A to 2D, the body 100 includes the base plate 110 and the sidewall 130 extending along the periphery of the base plate 110. For example, as illustrated in FIGS. 2A and 2B, the base plate 110 may have a flat shape extending in the xz-plane, while the sidewall 130 may extend along at least some of the edges of the base plate 110 in the xy-plane, e.g., the sidewall 130 may extend in the y-axis direction above and below the plane of the base plate 110.

The sidewall 130 may include the upper sidewall 132 on the upper side of the base plate 110 and the lower sidewall 134 on the lower side of the base plate 110, e.g., so the upper and lower sidewalls 132 and 134 may respectively protrude above and below the base plate 110. The upper substrate support 122 and the lower substrate support 124, which are respectively adjacent to the upper sidewall 132 and the lower sidewall 134, may protrude, e.g., in a step shape, from the upper surface and the lower surface of the base plate 110, respectively. The upper substrate support 122 and the lower substrate support 124 may respectively protrude from the upper surface and the lower surface of the base plate 110, the upper substrate support 122 and the lower substrate support 124 being adjacent to the upper sidewall 132 and the lower sidewall 134, respectively. A protruding height H1 of the upper substrate support 122 may be less than a height from the upper surface of the base plate 110 to the upper portion of the upper sidewall 132, and a protruding height H2 of the lower substrate support 124 may be less than a height from the lower surface of the base plate 110 to the lower portion of the lower sidewall 134.

A height H1 of the upper sidewall 132 may be greater than a height H2 of the lower sidewall 134. For convenience, referring to FIGS. 2C and 2D, the height H1 of the upper sidewall 132 and the height H2 of the lower sidewall 134 are illustrated with respect to the upper substrate support 122 and the lower substrate support 124, respectively. A height of the upper substrate support 122 from the upper surface of the base plate 110 and a height of the lower substrate support 124 from the lower surface of the base plate 110 may be identical to each other. Therefore, although the height H1 of the upper sidewall 132 and the height H2 of the lower sidewall 134 may be measured with respect to the upper and lower surfaces of the base plate 110 or the center of the base plate 110, the height H1 of the upper sidewall 132 may be greater than the height H2 of the lower sidewall 134.

In some embodiments, the total height of the sidewall 130 including the upper sidewall 132 and the lower sidewall 134 may be about 7 mm. The height from the top to the bottom of the sidewall 130 may be the same as a total thickness of the SSD apparatus (the SSD apparatus 1 of FIGS. 1A to 1D). That is, the sidewall 130 may form a sidewall of the entire exterior of the SSD apparatus 1.

The base plate 110, the upper substrate support 122, the lower substrate support 124, and the sidewall 130, which form the body 100, may be integrally formed. The body 100 may include a material that discharges heat generated within the body 100 and has strength that is strong enough to protect electronic components in the body 100.

The body 100 may include a single material or a combination of different materials by taking heat transfer characteristics into account. The body 100 may include, e.g., metal, a carbon-based material, a polymer material, or a combination thereof. However, one or more embodiments are not limited thereto. The body 100 may include, e.g., Cu, Sn, Zn, Al, stainless steel, or clad metal including the foregoing. Alternatively, the body 100 may include, e.g., a polymer material such as epoxy resin, polymethylmethacrylate (PMMA), polycarbonate (PC), polyethylene (PE), or polypropylene (PP).

The sidewall 130 may include the first sidewall groove 130H1 and the second sidewall groove 130H2 respectively on the first edge 100S1 and the second edge 100S2 of the body 100. That is, the first sidewall groove 130H1 and the second sidewall groove 130H2 may respectively be portions where the sidewall 130 is not formed on the first edge 100S1 and the second edge 100S2 of the body 100. In some embodiments, the first edge 100S1 and the second edge 100S2 of the body 100 may be connected to each other.

As illustrated in FIGS. 2A and 2B, the base plate 110 may include the connector housing portion 110R1 and the signal transmission medium housing portion 110R2 that are recessed towards the inside of the body 100 from the first sidewall groove 130H1 and the second sidewall groove 130H2, respectively. For example, as illustrated in FIGS. 2A and 2B, portions of the base plate 110 may be removed, e.g., to define openings through the base plate 110, so the first and second sidewall grooves 130H1 and 130H2 may be formed, e.g., to define space for respectively accommodating the external connector 500 and the signal transmission medium 400.

As further illustrated in FIGS. 2A and 2B, the base plate 110 may include the recess chip housing portion 112 extending from the upper surface of the base plate 110 toward the inside of the body 100, and the penetration chip housing portion 114 penetrating the upper surface of the base plate 110 to the lower surface thereof. For example, as illustrated in FIGS. 2A and 2C, a thickness of a portion of the base plate 110 adjacent the connector housing portion 110R1 may be reduced along the y-axis to define the recess chip housing portion 112. For example, as illustrated in FIGS. 2A and 2C, a portion of the base plate 110 may be completely removed to form an opening therethrough to define the penetration chip housing portion 114, e.g., the recess chip housing portion 112 may be between the penetration chip housing portion 114 and the connector housing portion 110R1 along the x-axis direction (FIG. 2A). For example, as illustrated in FIGS. 1C and 2C, a portion 110a of the base plate 110 may extend between the recess chip housing portion 112 and the penetration chip housing portion 114, and may be connected to the sidewall 130 to ensure stability of the base plate 110 and support of the first and second package substrate modules 200 and 300 thereon.

The first screw hole 152 and the second screw hole 154 for connecting the SSD apparatus 1 to the external device may be formed in a side portion and a lower portion of the body 100, respectively. It is illustrated that the second screw hole 154 is formed only in the lower portion of the body 100. However, one or more embodiments are not limited thereto. For example, the second screw hole 154 may be formed in both an upper portion and the lower portion of the body 100 or only in the upper portion thereof.

The upper portion and the lower portion of the body 100 may be mostly symmetrical to each other. The recess chip housing portion 112 may be formed on the upper portion of the body 100, but no corresponding structure may be formed on the lower portion of the body 100. The height H1 of the upper sidewall 132 may be greater than the height H2 of the lower sidewall 134.

Figure 3A:
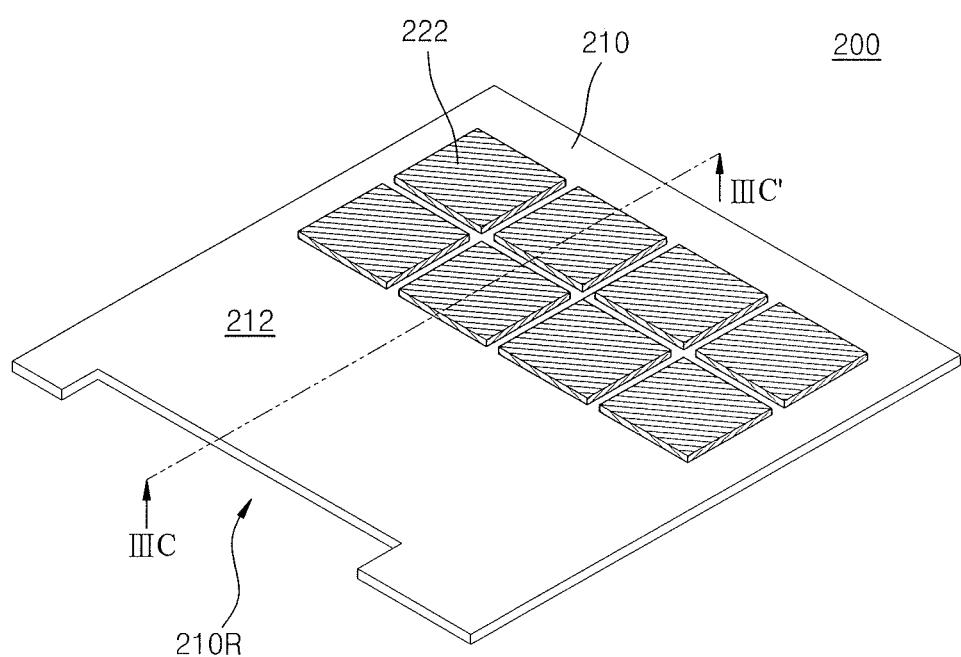
FIGS. 3A and 3B illustrate perspective views of a first package substrate module of an SSD apparatus in different directions, according to an embodiment.
Figure 3B:
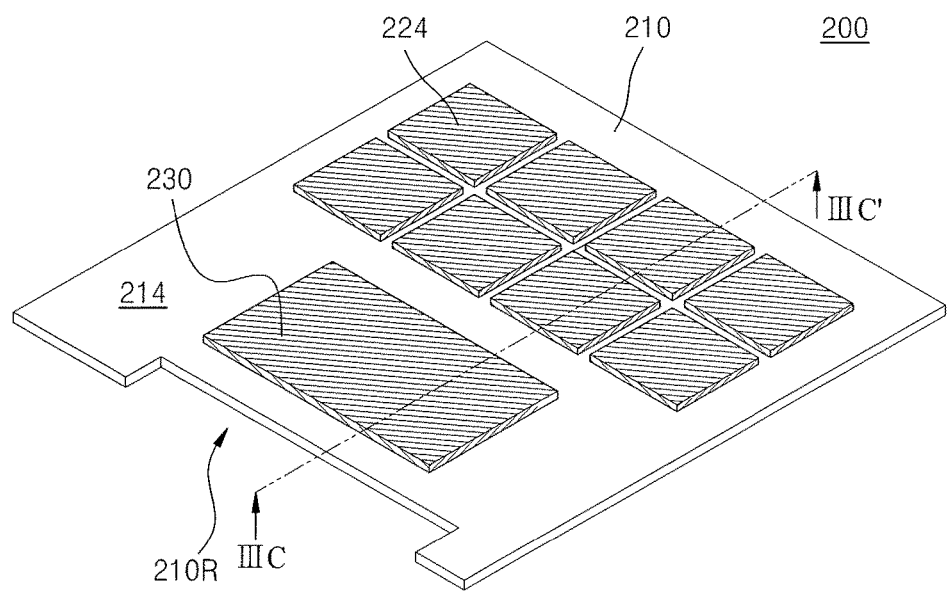
Figure 3C:
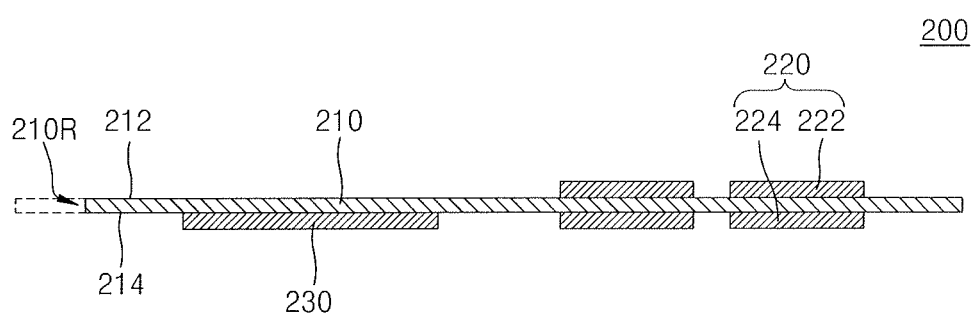
FIG. 3C illustrates a cross-sectional view of a first package substrate module of the SSD apparatus, according to an embodiment.

FIGS. 3A and 3B are perspective views of the first package substrate module 200 of the SSD apparatus 1 in different directions, according to an embodiment. FIG. 3C is a cross-sectional view of the first package substrate module 200 of the SSD apparatus 1, according to an embodiment. In detail, FIG. 3A is a perspective view of the first package substrate module 200 of the SSD apparatus 1 from the top, according to an embodiment. FIG. 3B is a perspective view of the first package substrate module 200 from the bottom. Also, FIG. 3C is a cross-sectional view taken along line IIIC-IIIC' of FIGS. 3A and 3B. Referring to FIG. 3C, the cross-sectional view along line IIIC-IIIC' is indicated by hatched areas, while the non-hatched area (indicated by dashed lines lines) is a portion separate from a cross-section taken along the line IIIC-IIIC' and indicates an opening (for clarity).

Referring to FIGS. 3A to 3C, the first package substrate module 200 may include the first package base substrate 210, the first semiconductor chips 220, and the controller chip 230. The first semiconductor chips 220 may include the first upper surface semiconductor chips 222 and the first lower surface semiconductor chips 224 respectively attached to the upper surface 212 and the lower surface 214 of the first package base substrate 210. The controller chip 230 may be attached to the lower surface 214 of the first package base substrate 210.

In some embodiments, the first package base substrate 210 may be a printed circuit board (PCB). For example, the first package base substrate 210 may be a double-sided PCB or a multi-layer PCB. The first package base substrate 210 may include a substrate base including at least one of, e.g., phenol resin, epoxy resin, and polyimide. The substrate base may include at least one of, e.g., a frame retardant 4, tetrafunctional epoxy, polyphenylene ether, epoxy/polyphenylene oxide, bismaleimide triazine (BT), thermount, cyanate ester, polyimide, and a liquid crystal polymer.

The first package base substrate 210 may have wire patterns formed on upper and lower surfaces of the substrate base. In some embodiments, when the substrate base includes multiple layers, the wire patterns may be formed between respective layers of the substrate base. In the substrate base of the first package base substrate 210, conductive vias may be formed to connect the wire patterns. The conductive vias completely or partially penetrate the substrate base and thus may electrically connect the wire patterns to each other. The wire patterns and/or the conductive vias may include, e.g., Cu, nickel (Ni), stainless steel, or beryllium copper.

Solder resist layers may be formed on the upper surface 212 and the lower surface 214 of the first package base substrate 210 so as to cover at least a portion of the wire patterns on the upper and lower surfaces of the substrate base. Portions of the wire patterns, which are arranged on the upper and lower surfaces of the substrate base and are not covered by the solder resist layers, may be used as pads for being electrically connected to the first semiconductor chips 220, the controller chip 230, an active element, or a passive element, which are attached to the upper surface 212 or the lower surface 214 of the first package base substrate 210.

The first package base substrate 210 may include a first substrate connector housing portion 210R recessed from a side surface of the first package base substrate 210 towards the inside of the first package base substrate 210 so as to correspond to the connector housing portion 110R1 of the base plate 110 of FIGS. 2A and 2B. The first substrate connector housing portion 210R may be coupled to a connector (the external connector 500 of FIGS. 1A and 1B). The external connector 500 coupled to the first substrate connector housing portion 210R may be electrically connected to the first package base substrate 210.

The first semiconductor chips 220 and the controller chip 230 may each include a semiconductor substrate. The semiconductor substrate may include, e.g., silicon (Si). Alternatively, the semiconductor substrate may include a semiconductor element, e.g., germanium (Ge), or compound semiconductors, e.g., silicon carbide (SiC), gallium arsenide (GaAs), indium arsenide (InAs), and indium phosphide (InP). The semiconductor substrate may have an active surface and an inactive surface opposite the active surface. The first semiconductor chips 220 and the controller chip 230 may each include a semiconductor device including various types of individual devices on the active surface of the semiconductor substrate.

The first semiconductor chips 220 may be a non-volatile memory device. The non-volatile memory device may be, e.g., flash memory, phase-change random access memory (PRAM), resistive random access memory (RRAM), ferroelectric random access memory (FeRAM), magnetic random access memory (MRAM), or the like. However, one or more embodiments are not limited thereto. The flash memory may be, e.g., NAND flash memory. The flash memory may be, e.g., V-NAND flash memory. The non-volatile memory device may include one semiconductor die or a stack of multiple semiconductor dies.

The controller chip 230 may control the first semiconductor chips 220. The controller chip 230 may include a controller therein. The controller may control access to data stored in the non-volatile memory device. That is, the controller may control read/write operations of the non-volatile memory device, e.g., flash memory, according to control commands from an external host. The controller may be a separate control semiconductor chip, e.g., an application specific integrated circuit (ASIC). For example, when the SSD apparatus 1 (of FIGS. 1A to 1D) is connected to the external host, the controller may be automatically executed by an operating system of the external host. The controller may provide a standard protocol, e.g., PATA, SATA, SCSI, or PCIe. Also, the controller may perform wear leveling, garbage collection, bad block management, error correcting code (ECC) for the non-volatile memory device. In this case, the controller may include a script for automatic execution and an application program executable by the external host.

The first package substrate module 200 may further include a semiconductor chip that is a volatile memory device attached to the first package base substrate 210. The volatile memory device may be, e.g., dynamic random access memory (DRAM), static random access memory (SRAM), synchronous DRAM (SDRAM), double data rate random access memory (DDR RAM), resistive DRAM (RDRAM), or the like, but is not limited thereto. The volatile memory device may provide a cache function for storing data that is frequently used by the external host to access the SSD apparatus 1 and, thus, may scale an access time and data transfer performance in accordance with process performance of the external host connected to the SSD apparatus 1. Also, the first package substrate module 200 may further include an active element or a passive element, e.g., a chip resistor, a chip capacitor, an inductor, a switch, a temperature sensor, a direct current (DC)-DC converter, a quartz for generating clock signals, a voltage regulator, or the like, any one of which is attached to the first package substrate module 200.

Figure 4A:
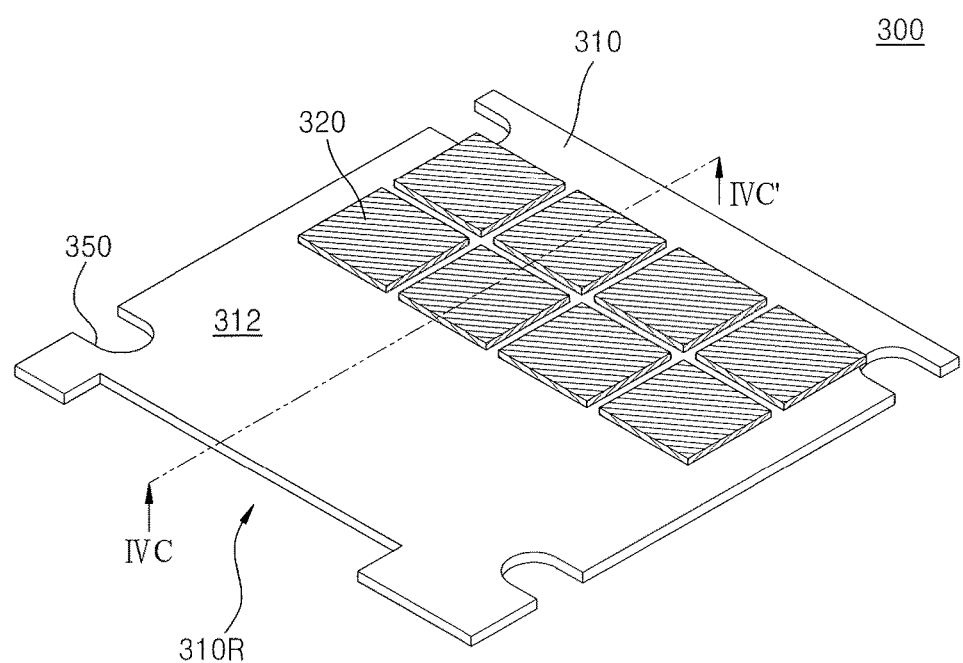
FIGS. 4A and 4B illustrate perspective views of a second package substrate module of a SSD apparatus in different directions, according to an embodiment.
Figure 4B:
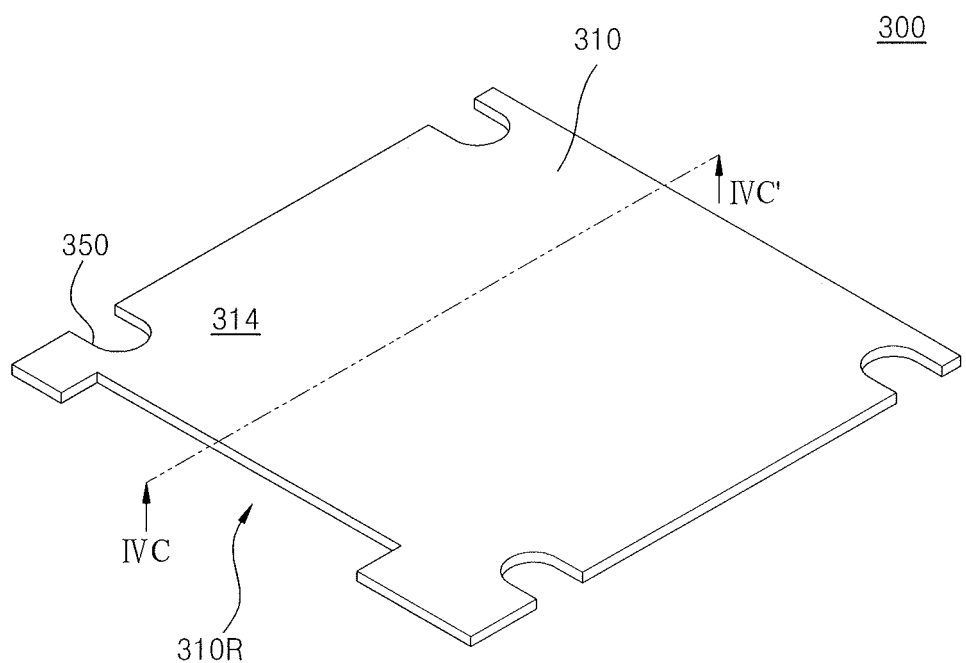
Figure 4C:
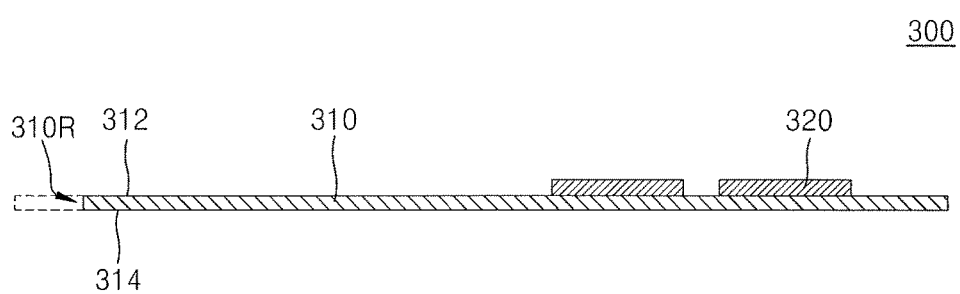
FIG. 4C illustrates a cross-sectional view of a second package substrate module of the SSD apparatus, according to an embodiment.

FIGS. 4A and 4B are perspective views of the second package substrate module 300 of the SSD apparatus 1 in different directions, according to an embodiment. FIG. 4C is a cross-sectional view of the second package substrate module 300 of the SSD apparatus 1, according to an embodiment. In detail, FIG. 4A is a perspective view of the second package substrate module 300 of the SSD apparatus 1 from the top, according to an embodiment, and FIG. 4B is a perspective view of the second package substrate module 300 from the bottom. Also, FIG. 4C is a cross-sectional view, taken along line IVC-IVC' of FIGS. 4A and 4B (indicated by hatched areas). A dashed portion in FIG. 4C is a portion separate from the cross-section taken along the line IVC-IVC' and indicates an opening (for clarity).

Referring to FIGS. 4A to 4C, the second package substrate module 300 may include the second package base substrate 310 and the second semiconductor chips 320. The second semiconductor chips 320 may be attached to the upper surface 312 of the second package base substrate 310, but may not be attached to the lower surface 314 thereof.

The second package base substrate 310 and the second semiconductor chips 320 may be similar to the first package base substrate 210 and the first semiconductor chips 220 described with reference to FIGS. 3A to 3C, respectively, and thus repeated descriptions will be omitted herein.

The second package base substrate 310 may include a substrate base. The second package base substrate 310 may have wire patterns formed on upper and lower surfaces of the substrate base. In some embodiments, when the substrate base includes multiple layers, the wire patterns may be formed between respective layers of the substrate base. In the substrate base of the second package base substrate 310, conductive vias connecting the wire patterns may be formed. The conductive vias may completely or partially penetrate the substrate base and may electrically connect the wire patterns to each other.

Solder resist layers may be formed on the upper surface 312 and the lower surface 314 of the second package base substrate 310 so as to cover at least a portion of the wire pattern on the upper surface of the substrate base and completely cover the lower surface of the substrate base. A portion of the wire pattern, which is on the upper surface of the substrate base and is not covered by the solder resist layers, may be used as a pad for being electrically connected to the second semiconductor chips 320, an active element, or a passive element which are attached to the upper surface 312 of the second package base substrate 310.

The second package base substrate 310 may include a second substrate connector housing portion 310R recessed from a side surface of the second package base substrate 310 towards the inside of the second package base substrate 310 so as to correspond to the connector housing portion 110R1 of the base plate 110 of FIGS. 2A and 2B. The connector (the external connector 500 of FIGS. 1A and 1B) may be housed in the second substrate connector housing portion 310R. The external connector 500 coupled to the second substrate connector housing portion 310R may be apart from the second package base substrate 310 with a gap therebetween. That is, the external connector 500 may not be connected to the second package substrate module 300.

The second semiconductor chips 320 may be a non-volatile memory device. The non-volatile memory device may be, e.g., flash memory, PRAM, RRAM, FeRAM, MRAM, or the like. However, one or more embodiments are not limited thereto. The flash memory may be, e.g., NAND flash memory. The flash memory may be, e.g., V-NAND flash memory. The non-volatile memory device may include one semiconductor die or a stack of multiple semiconductor dies.

The second package substrate module 300 may further include an active element or a passive element, e.g., a chip resistor, a chip capacitor, an inductor, a switch, a temperature sensor, a DC-DC converter, a quartz for generating clock signals, or a voltage regulator, which is attached to the upper surface 312 of the second package base substrate 310.

In some embodiments, the semiconductor chip, the active element, or the passive element may not be attached to the lower surface 314 of the second package base substrate 310 of the second package substrate module 300. The lower surface 314 of the second package base substrate 310 may be completely covered by the solder resist layer.

The second package base substrate 310 may have a screw hole housing portion 350 recessed from a side surface of the second package base substrate 310 towards the inside of the second package base substrate 310 so as to correspond to a portion of the second screw hole 154 of the body 100 of FIG. 2B. When the body 100 does not include the second screw hole 154, the screw hole housing portion 350 may not be formed.

FIGS. 1A to 4C illustrate that the first package substrate module 200 is housed in the area defined by the upper surface of the base plate 110 and the upper sidewall 132 and the second package substrate module 300 is housed in the area defined by the lower surface of the base plate 110 and the lower sidewall 134. However, one or more embodiments are not limited thereto. That is, the first package substrate module 200 may be housed in the area defined by the lower surface of the base plate 110 and the lower sidewall 134, and the second package substrate module 300 may be housed in the area defined by the upper surface of the base plate 110 and the upper sidewall 132. In this case, a height of the upper sidewall 132 may be less than a height of the lower sidewall 134. Also, the terminal 510 of the external connector 500 may be electrically connected to the first package substrate module 200 through the second package substrate module 300.

Figure 5:
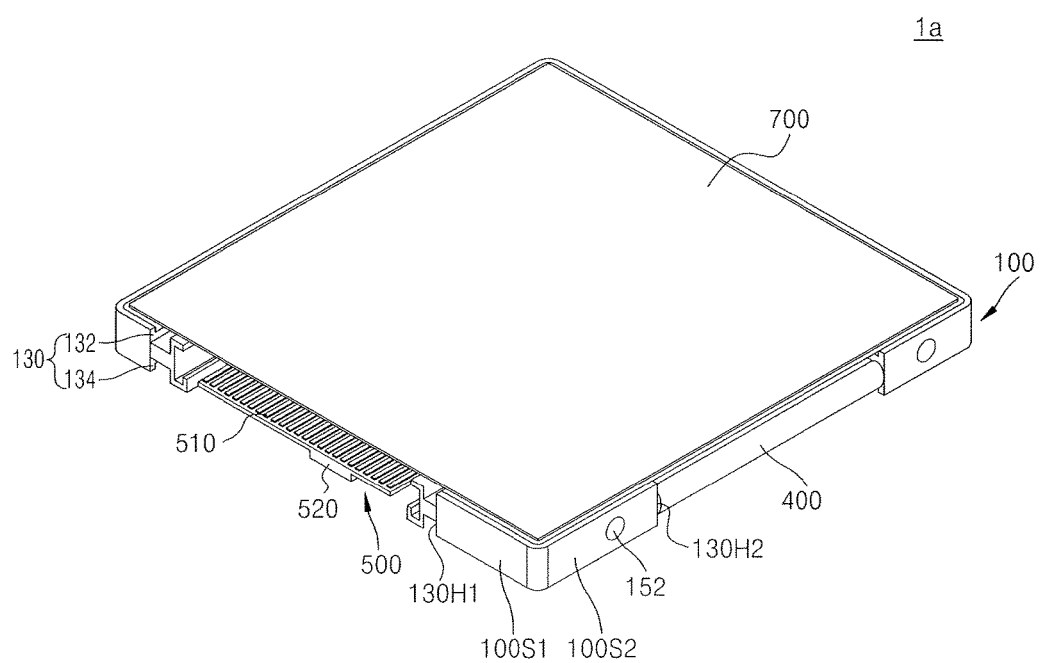
FIG. 5 illustrates a perspective view of a SSD apparatus according to an embodiment.

FIG. 5 is a perspective view of a SSD apparatus 1a according to an embodiment.

Referring to FIG. 5, the SSD apparatus 1a is mostly similar to the SSD apparatus 1 described with reference to FIGS. 1A to 1D. However, unlike the SSD apparatus 1 of FIGS. 1A to 1D, in the SSD apparatus 1a, the second sidewall groove 130H2 may not be coupled to the sidewall groove covering part 750. Therefore, when viewed from the outside, the signal transmission medium 400 of the SSD apparatus 1a may be exposed through the second sidewall groove 130H2.

Figure 6A:
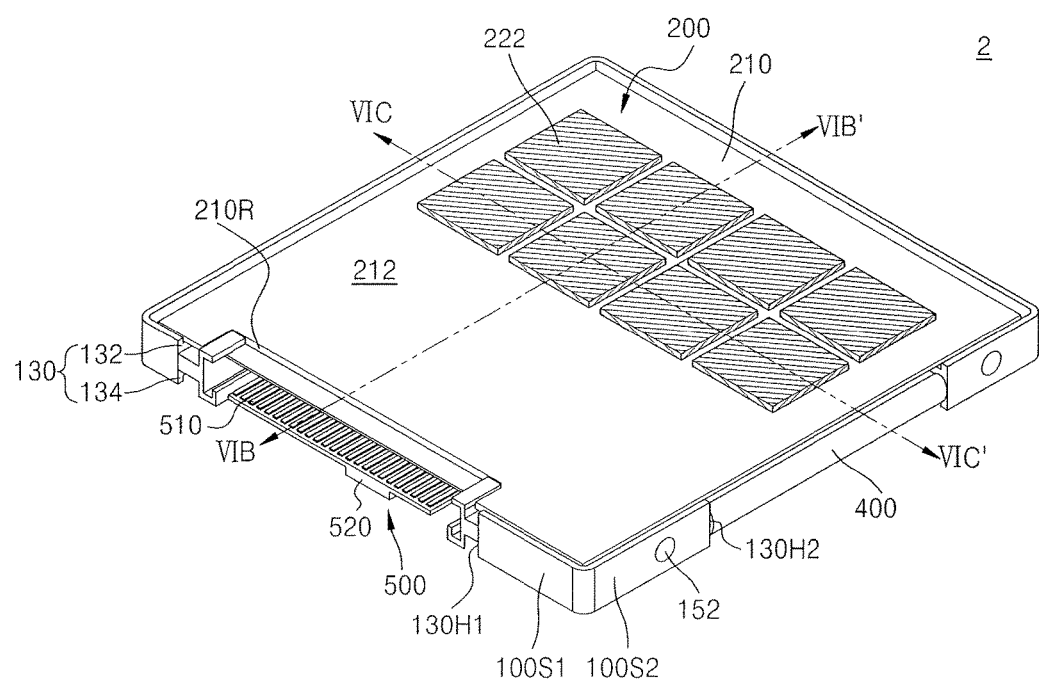
FIG. 6A illustrates a perspective view of a SSD apparatus according to an embodiment.
Figure 6B:
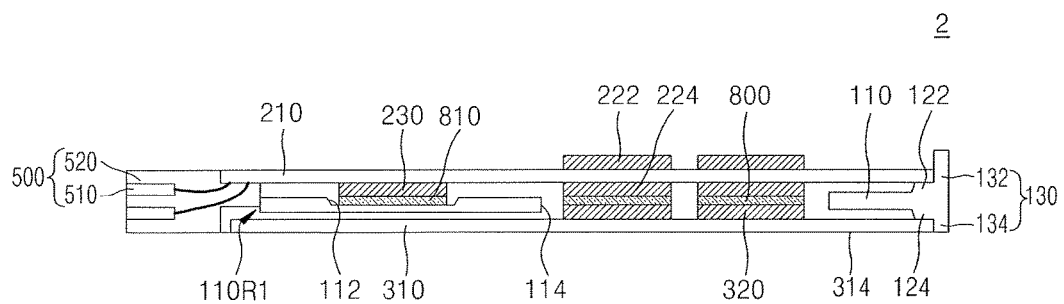
FIGS. 6B and 6C illustrate cross-sectional views of a SSD apparatus, taken along different directions, according to an embodiment.
Figure 6C:
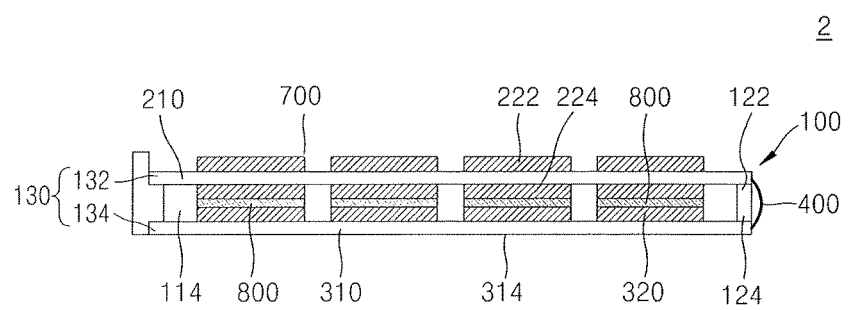

FIG. 6A is a perspective view of a SSD apparatus 2 according to an embodiment. FIGS. 6B and 6C are cross-sectional views of the SSD apparatus 2, taken along different directions, according to an embodiment. In detail, FIG. 6A is a perspective view of the SSD apparatus 2 from the top, according to an embodiment. FIGS. 6B and 6C are cross-sectional views, taken along lines VIB-VIB' and VIC-VIC' of FIG. 6A.

Referring to FIGS. 6A to 6C, the SSD apparatus 2 is mostly similar to the SSD apparatus 1a described with reference to FIG. 5. However, unlike the SSD apparatus 1a of FIG. 5, in the SSD apparatus 2, the upper portion of the upper sidewall 132 of the body 100 may not be connected to the upper surface cover portion 700. Therefore, when viewed from the outside, the first package substrate module 200, particularly, the upper surface 212 of the first package base substrate 210 and the first upper surface semiconductor chips 222 attached to the upper surface 212, may be exposed through an upper side of the SSD apparatus 2. Upper surfaces of the first upper surface semiconductor chips 222 and the upper portion of the upper sidewall 132 may be on the same plane.

Figure 7A:
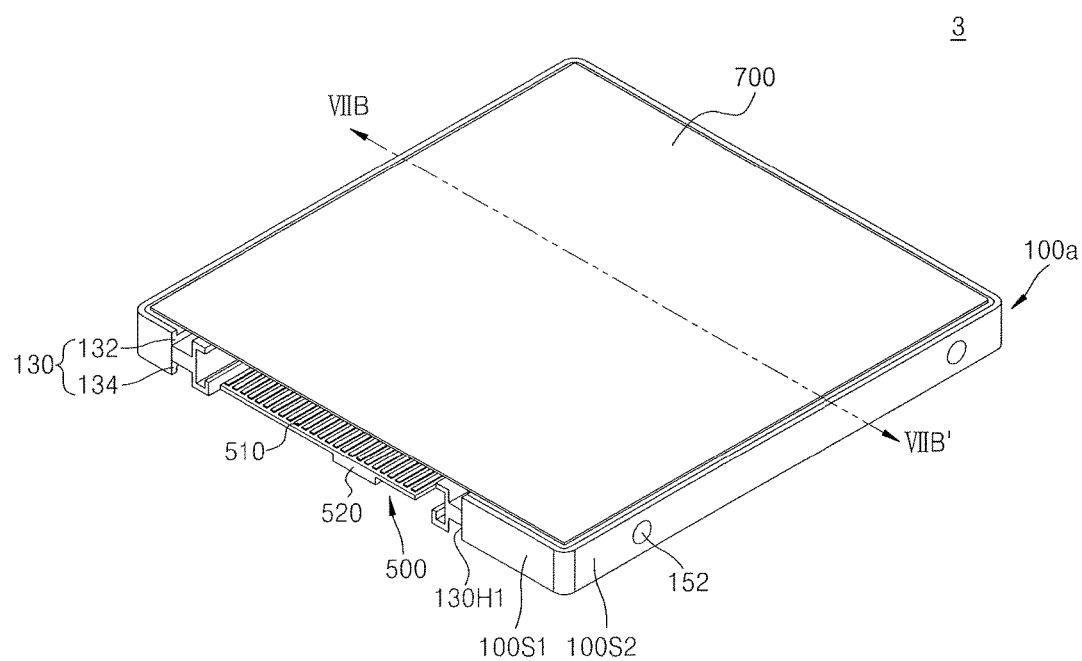
FIG. 7A illustrates a perspective view of a SSD apparatus according to an embodiment.
Figure 7B:
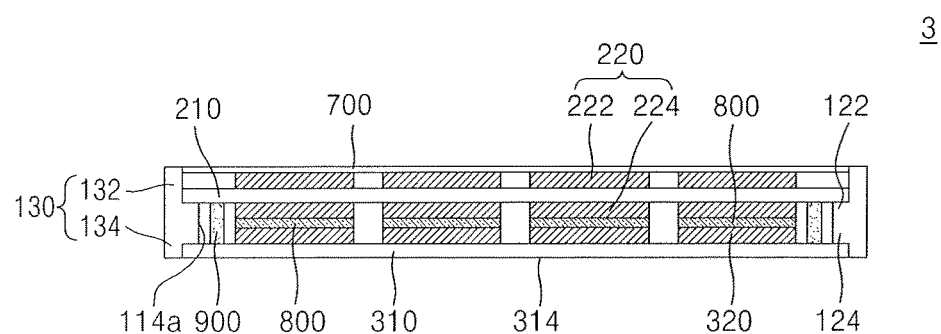
FIG. 7B illustrates a cross-sectional view of the SSD apparatus according to an embodiment.

FIG. 7A is a perspective view of a SSD apparatus 3 according to an embodiment. FIG. 7B is a cross-sectional view of the SSD apparatus 3 according to an embodiment. In detail, FIG. 7A is a perspective view of the SSD apparatus 3 from the top, according to an embodiment. FIG. 7B is a cross-sectional view, taken along line VIIB-VIIB' of FIG. 7A.

Referring to FIGS. 7A and 7B, the SSD apparatus 3 is mostly similar to the SSD apparatus 1 described with reference to FIGS. 1A to 1D. However, unlike the body 100 of the SSD apparatus 1 of FIGS. 1A to 1D, the SSD apparatus 3 does not include the second sidewall groove 130H2. That is, a body 100a of the SSD apparatus 3 may be formed in such a manner that the body 100 of the SSD apparatus 1 of FIGS. 1A to 1D is integrally formed with the sidewall groove covering part 750.

The first package substrate module 200 and the second package substrate module 300 may be electrically connected to each other by a signal transmission medium 900. The signal transmission medium 900 may be, e.g., a Board-to-Board (BtoB) connector, a Flat Flexible Cable (FFC) connector, or a Flexible Printed Circuitry (FPC) connector. The signal transmission medium 900 may be on a penetration chip housing portion 114a. The SSD apparatus 3 may electrically connect the first package substrate module 200 and the second package substrate module 300 to each other by using the signal transmission medium 900 instead of the signal transmission medium 400 of FIG. 1D. Therefore, the body 100a of the SSD apparatus 3 may not include the signal transmission medium housing portion 110R2 of FIG. 1D which is recessed.

Figure 8:
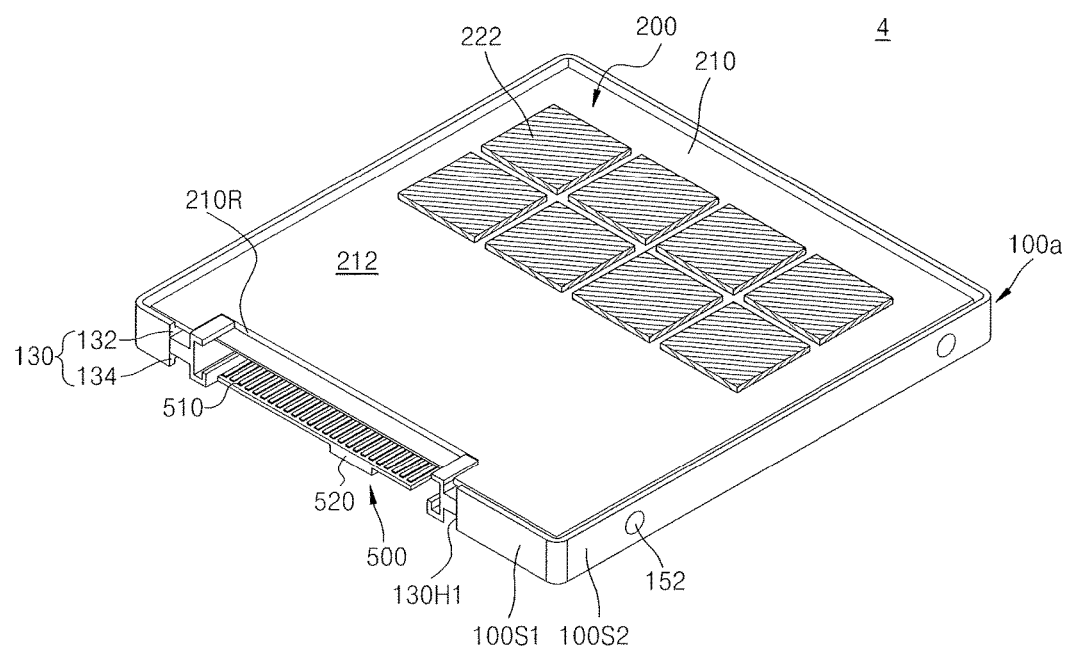
FIG. 8 illustrates a perspective view of a SSD apparatus according to an embodiment.

FIG. 8 is a perspective view of an SSD apparatus 4 according to an embodiment.

Referring to FIG. 8, the SSD apparatus 4 is mostly similar to the SSD apparatus 1a described with reference to FIG. 5. However, unlike the SSD apparatus 1a of FIG. 5, in the SSD apparatus 4, the upper surface cover portion 700 may not be coupled to the upper portion of the upper sidewall 132 of the body 100. Therefore, when the SSD apparatus 4 is viewed from the outside, the first package substrate module 200, particularly, the upper surface 212 of the first package base substrate 210 and the first upper surface semiconductor chips 222 attached to the upper surface 212, may be exposed through an upper side of the SSD apparatus 4. The upper surfaces of the first upper surface semiconductor chips 222 and the upper portion of the upper sidewall 132 may be on the same plane.

Figure 9A:
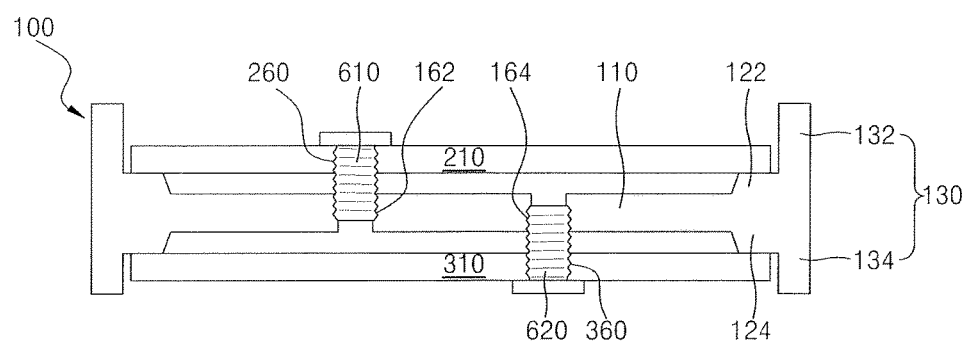
FIGS. 9A and 9B illustrate cross-sectional views, respectively, of states in which a first package base substrate and a second package base substrate of a SSD apparatus are coupled to a body, according to an embodiment.
Figure 9B:
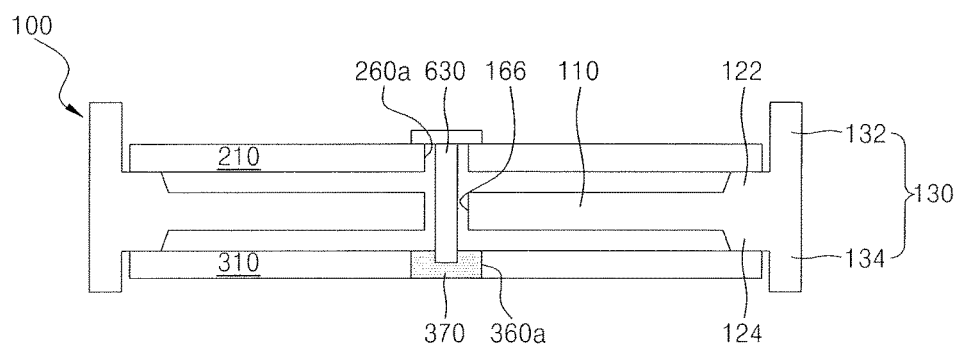

FIGS. 9A and 9B are cross-sectional views illustrating states in which the first package base substrate 210 and the second package base substrate 310 of an SSD apparatus are coupled to the body 100, according to an embodiment.

Referring to FIG. 9A, the first package base substrate 210 and the second package base substrate 310) may be fixed to the body 100 by a first fixing member 610 and a second fixing member 620, respectively. The first fixing member 610 and the second fixing member 620 may be, e.g., screws. The first fixing member 610 may be coupled to a first base hole 260 penetrating the first package base substrate 210 and a first plate hole 162 penetrating the base plate 110 of the body 100. The second fixing member 620 may be coupled to a second base hole 360 penetrating the second package base substrate 310 and a second plate hole 164 penetrating the base plate 110 of the body 100.

Referring to FIG. 9B, the first package base substrate 210 and the second package base substrate 310 may be fixed to the body 100 by a fixing member 630. The fixing member 630 may be, e.g., a screw or a threadless bolt.

The first package base substrate 210 and the second package base substrate 310 may include a first base hole 260a penetrating the first package base substrate 210 and a second base hole 360a penetrating the second package base substrate 310, respectively. The body 100 may include a plate hole 166 penetrating the base plate 110. The second base hole 360a may be filled with a coupling part 370 coupled to the fixing member 630.

A head of the fixing member 630 contacts the upper surface of the first package base substrate 210 and penetrates the first base hole 260a and the plate hole 166, and thus, an end portion opposite to the head of the fixing member 630 may be coupled to the coupling part 370 filling the second base hole 360a. Therefore, the first package base substrate 210 and the second package base substrate 310 may be coupled to the body 100 by the fixing member 630.

By way of summation and review, a solid state drive (SSD) apparatus according to embodiments may satisfy both capacity increase and volume decrease. That is, according to embodiments, it is possible to secure a space where components are mounted and to increase capacity of the SSD, e.g., to mount two printed circuit boards (PCBs) on a thin SSD (e.g., as opposed to only one). When a space where a double-sided PCB is mounted is greater than a space where a single-sided PCB is mounted, and when a lower surface of the single-sided PCB is used as an exterior of the SSD, a thickness of the SSD may be reduced, and the space where the components are mounted may be secured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A solid state drive (SSD) apparatus, comprising:
   a body including a base plate and a sidewall extending along a periphery of the base plate, the sidewall including an upper sidewall protruding from an upper surface of the base plate and a lower sidewall protruding from a lower surface of the base plate;
   a first package substrate module housed in an area defined by the upper surface of the base plate and the upper sidewall; and
   a second package substrate module housed in an area defined by the lower surface of the base plate and the lower sidewall, first and second package base substrates of the first and second package substrate modules, respectively, being on opposite surfaces of the base plate,
   wherein a height of the upper sidewall is greater than a height of the lower sidewall.

2. The SSD apparatus as claimed in claim 1, wherein the first package substrate module has a dual in-lined memory module (DIMM) including:
   the first package base substrate; and
   a plurality of first semiconductor chips including a plurality of first upper surface semiconductor chips mounted on an upper surface of the first package base substrate and a plurality of first lower surface semiconductor chips mounted on a lower surface of the first package base substrate.

3. The SSD apparatus as claimed in claim 2, wherein the second package substrate module has a single in-lined memory module (SIMM) including:
the second package base substrate; and
a plurality of second semiconductor chips mounted on an upper surface of the second package base substrate, the plurality of second semiconductor chips of the second package substrate module facing and overlapping the plurality of first lower surface semiconductor chips of the first package substrate module via an insulator.

4. The SSD apparatus as claimed in claim 3, wherein:
the base plate includes a penetration chip housing portion penetrating the base plate from the upper surface of the base plate to the lower surface of the base plate, the penetration chip housing portion being an opening through an entire thickness of the base plate, and
the plurality of first lower surface semiconductor chips and the plurality of second semiconductor chips that are facing and overlapping each other are housed in the penetration chip housing portion between the first and second package base substrates.

5. The SSD apparatus as claimed in claim 4, wherein the first package substrate module and the second package substrate module are electrically connected to each other by a signal transmission medium, the signal transmission medium being a connector in the penetration chip housing portion.

6. The SSD apparatus as claimed in claim 3, further comprising a controller chip attached to a lower surface of the first package substrate module,
wherein the base plate includes a recess chip housing portion extending from the upper surface of the base plate to an inside of the base plate, and
wherein a portion of the controller chip is housed in the recess chip housing portion.

7. The SSD apparatus as claimed in claim 3, wherein upper surfaces of the plurality of first upper surface semiconductor chips and an upper portion of the upper sidewall are on a same plane.

8. The SSD apparatus as claimed in claim 3, further comprising an upper surface cover portion that covers an upper portion of the first package substrate module and is coupled to an upper portion of the upper sidewall,
wherein an upper surface of the upper surface cover portion and the upper portion of the upper sidewall are on a same plane.

9. The SSD apparatus as claimed in claim 3, wherein a lower surface of the second package base substrate and a lower portion of the lower sidewall are on a same plane.

10. The SSD apparatus as claimed in claim 1, wherein;
the sidewall includes a first sidewall groove in a first edge of the body, and
the base plate includes a connector housing portion that is recessed from the first sidewall groove to an inside of the base plate and houses an external connector connected to the first package substrate module.

11. The SSD apparatus as claimed in claim 10, wherein;
the sidewall includes a second sidewall groove in a second edge connected to the first edge of the body,
the base plate includes a signal transmission medium housing portion recessed from the second sidewall groove to the inside of the base plate, and
the first package substrate module and the second package substrate module are electrically connected to each other by a signal transmission medium that is a film cable housed in the signal transmission medium housing portion.

12. A solid state drive (SSD) apparatus, comprising:
a body including a base plate and a sidewall extending along a periphery of the base plate, the base plate including a penetration chip housing portion penetrating the base plate from an upper surface of the base plate to a lower surface of the base plate, and the sidewall including an upper sidewall protruding from the upper surface of the base plate and a lower sidewall protruding from the lower surface of the base plate;
a first package substrate module housed in an area defined by the upper surface of the base plate and the upper sidewall, the first package substrate module including:
a first package base substrate, and
a plurality of first semiconductor chips that include a plurality of first upper surface semiconductor chips mounted on an upper surface of the first package base substrate, and a plurality of first lower surface semiconductor chips mounted on a lower surface of the first package base substrate; and
a second package substrate module housed in an area defined by the lower surface of the base plate and the lower sidewall, the second package substrate module including:
a second package base substrate, the first and second package base substrates being on opposite surfaces of the base plate, and
a plurality of second semiconductor chips mounted on an upper surface of the second package base substrate,
wherein a portion of the plurality of first lower surface chips and a portion of the plurality of second semiconductor chips are housed in the penetration chip housing portion.

13. The SSD apparatus as claimed in claim 12, wherein:
the base plate includes a recess chip housing portion extending from the upper surface of the base plate to an inside of the base plate, and
the first package substrate module further includes a controller chip that is attached to a lower surface of the first package substrate module and has a portion housed in the recess chip housing portion.

14. The SSD apparatus as claimed in claim 12, wherein a height of the upper sidewall is greater than a height of the lower sidewall.

15. The SSD apparatus as claimed in claim 12, wherein the lower surface of the second package base substrate and a lower portion of the lower sidewall are on a same plane.

16. The SSD apparatus as claimed in claim 12, further comprising:
an external connector connected to the first package substrate module; and
a signal transmission medium connecting the first package substrate module to the second package substrate module.

17. The SSD apparatus as claimed in claim 16, wherein the signal transmission medium includes a connector disposed in the penetration chip housing portion.

18. The SSD apparatus as claimed in claim 16, wherein the signal transmission medium includes a film cable.

19. A solid state drive (SSD) apparatus, comprising:
a body including a base plate and a sidewall extending along a periphery of the base plate, the sidewall including an upper sidewall protruding from an upper surface of the base plate and a lower sidewall protruding from lower surface of the base plate;

a first package substrate module housed in an area defined by the upper surface of the base plate and the upper sidewall, the first package substrate module including:
a first package base substrate, and
a plurality of first semiconductor chips that include a plurality of first upper surface semiconductor chips mounted on an upper surface of the first package base substrate and a plurality of first lower surface semiconductor chips mounted on a lower surface of the first package base substrate; and a second package substrate module housed in an area defined by the lower surface of the base plate and the lower sidewall, the second package substrate module including a second package base substrate and a plurality of second semiconductor chips mounted on an upper surface of the second package base substrate, the first and second package base substrates being on opposite surfaces of the base plate, wherein a lower surface of the second package base substrate and a lower portion of the lower sidewall are on a same plane.

20. The SSD apparatus as claimed in claim 19, wherein:

the base plate includes a penetration chip housing portion penetrating the base plate from the upper surface of the base plate to the lower surface of the base plate, a portion of the plurality of first lower surface semiconductor chips and a portion of the plurality of second semiconductor chips are housed in the penetration chip housing portion, and upper surfaces of the plurality of first upper surface semiconductor chips and an upper portion of the upper sidewall are on a same plane.

* * * * *